US012574020B2

(12) United States Patent
Kong et al.

(10) Patent No.:  US 12,574,020 B2
(45) Date of Patent:  Mar. 10, 2026

(54) DYNAMIC EYE OPENING MONITOR

(71) Applicant: QUALCOMM Incorporated, San Diego, CA (US)

(72) Inventors: Xiaohua Kong, San Diego, CA (US); Julian Puscar, Holly Springs, NC (US)

(73) Assignee: QUALCOMM INCORPORATED, San Diego, CA (US)

( * ) Notice: Subject to any disclaimer, the term of this patent is extended or adjusted under 35 U.S.C. 154(b) by 182 days.

(21) Appl. No.: 18/631,885

(22) Filed: Apr. 10, 2024

(65) Prior Publication Data

US 2025/0323632 A1      Oct. 16, 2025

(51) Int. Cl.
*H03K 5/13* (2014.01)
*H03K 5/00* (2006.01)

(52) U.S. Cl.
CPC ..... *H03K 5/13* (2013.01); *H03K 2005/00286* (2013.01)

(58) Field of Classification Search
CPC ....................... H03K 5/13; H03K 2005/00286
USPC ......................................................... 327/231
See application file for complete search history.

(56) References Cited

U.S. PATENT DOCUMENTS

| | | | | |
|---|---|---|---|---|
| 9,300,500 | B2 * | 3/2016 | Cho ................... | H04L 25/03885 |
| 10,341,147 | B1 * | 7/2019 | Khare ............... | H04L 25/03019 |
| 10,574,487 | B1 * | 2/2020 | Hormati ............ | H04L 25/03146 |
| 10,673,548 | B2 * | 6/2020 | Simpson ............... | H04L 1/0041 |

| | | | | |
|---|---|---|---|---|
| 10,721,106 | B1 * | 7/2020 | Hormati ............ | H04L 25/03019 |
| 10,785,072 | B2 * | 9/2020 | Hormati ............ | H04L 25/03885 |
| 10,797,683 | B1 * | 10/2020 | Jain ...................... | H03K 5/1565 |
| 10,965,290 | B2 * | 3/2021 | Tajalli ................. | H04L 25/0272 |
| 11,736,265 | B2 * | 8/2023 | Hormati .................. | H04L 27/02 |
| | | | | 375/355 |
| 11,815,551 | B1 * | 11/2023 | Fayneh ............ | G01R 31/31726 |
| 11,881,971 | B2 * | 1/2024 | Zhan ................. | H04L 25/03267 |
| 2008/0063127 | A1 * | 3/2008 | Hayashi ........... | G01R 31/31725 |
| | | | | 375/362 |
| 2009/0231001 | A1 * | 9/2009 | Fukuda ..................... | H03L 7/08 |
| | | | | 327/144 |
| 2010/0019800 | A1 * | 1/2010 | Wang ...................... | H03L 7/091 |
| | | | | 327/157 |
| 2012/0299600 | A1 * | 11/2012 | Oshima ............ | G01R 31/31726 |
| | | | | 324/537 |
| 2014/0003480 | A1 * | 1/2014 | Qu ........................ | H03L 7/0998 |
| | | | | 375/226 |
| 2015/0139375 | A1 * | 5/2015 | Doi .......................... | H04L 25/14 |
| | | | | 375/356 |

(Continued)

*Primary Examiner* — Ryan Jager
(74) *Attorney, Agent, or Firm* — Loza & Loza, LLP

(57) ABSTRACT

A method for identifying margins in an eye opening includes capturing first data from a data signal based on edges in a data clock signal, capturing second data from the data signal responsive to edges in a phase shifted version of the data clock signal, iteratively increasing phase difference between the phase shifted version of the data clock signal and the data clock signal when the first data initially matches the second data until the first data differs from the second data, iteratively decreasing the phase difference between the phase shifted version of the data clock signal and the data clock signal when the first data initially differs from the second data until the first data matches the second data, and determining the margin of the eye opening when the first data begins to match the second data or when the first data begins to differ from the second data.

20 Claims, 8 Drawing Sheets

(56) References Cited

U.S. PATENT DOCUMENTS

2023/0170891 A1 * 6/2023 Lee .......................... H03K 5/26
327/199
2025/0323632 A1 * 10/2025 Kong ....................... H03K 5/13

* cited by examiner

Late Clocking

Early Clocking

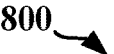

800

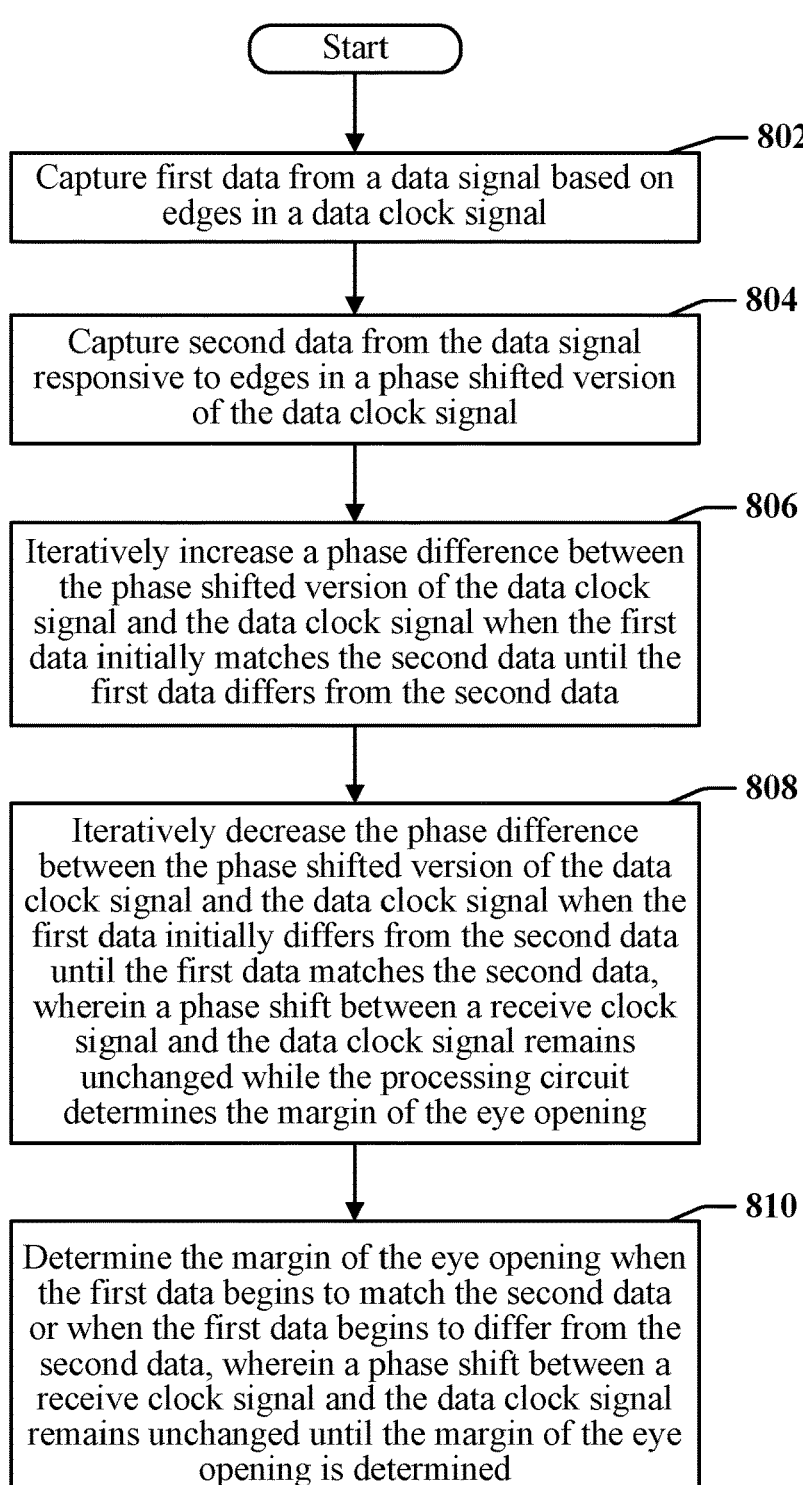

Start

802

Capture first data from a data signal based on edges in a data clock signal

804

Capture second data from the data signal responsive to edges in a phase shifted version of the data clock signal

806

Iteratively increase a phase difference between the phase shifted version of the data clock signal and the data clock signal when the first data initially matches the second data until the first data differs from the second data

808

Iteratively decrease the phase difference between the phase shifted version of the data clock signal and the data clock signal when the first data initially differs from the second data until the first data matches the second data, wherein a phase shift between a receive clock signal and the data clock signal remains unchanged while the processing circuit determines the margin of the eye opening

810

Determine the margin of the eye opening when the first data begins to match the second data or when the first data begins to differ from the second data, wherein a phase shift between a receive clock signal and the data clock signal remains unchanged until the margin of the eye opening is determined

*FIG. 8*

DYNAMIC EYE OPENING MONITOR

TECHNICAL FIELD

The present disclosure generally relates to eye opening monitors provided in receiving devices to monitor timing of data capture, more particularly, to an eye opening monitor that can operate when data is transferred over a serial data link.

BACKGROUND

Electronic device technologies have seen explosive growth over the past several years. For example, growth of cellular and wireless communication technologies has been fueled by better communications, hardware, larger networks, and more reliable protocols. Wireless service providers are now able to offer their customers an ever-expanding array of features and services, and provide users with unprecedented levels of access to information, resources, and communications. To keep pace with these service enhancements, mobile electronic devices (e.g., cellular phones, tablets, laptops, etc.) have become more powerful and complex than ever. Wireless devices may include a high-speed bus interface for communication of signals between hardware components. For example, the high-speed bus interface may be implemented using a Peripheral Component Interconnect Express (PCIe) bus. High frequency signals being communicated using the bus interface may experience attenuation, interference and timing drift. There is an ongoing need to monitor the configuration and operation of receiving circuits when data links are subject to dynamic changes.

SUMMARY

Certain aspects of the disclosure relate to systems, apparatus, methods and techniques for monitoring channel conditions. An eye opening monitor may be used to determine and configure sampling points for a receiving device.

In various aspects of the disclosure, an eye opening monitor has a first sampling circuit, a second sampling circuit and a processing circuit. The first sampling circuit is configured to capture first data from a data signal responsive to edges in a data clock signal. The second sampling circuit is configured to capture second data from the data signal responsive to edges in a phase shifted version of the data clock signal. The processing circuit is configured to determine a margin of an eye opening by iteratively increasing a phase difference between the phase shifted version of the data clock signal and the data clock signal when the first data initially matches the second data until the first data differs from the second data or iteratively decreasing the phase difference between the phase shifted version of the data clock signal and the data clock signal when the first data initially differs from the second data until the first data matches the second data. A phase shift between a receive clock signal and the data clock signal remains unchanged while the processing circuit determines the margin of the eye opening.

In various aspects of the disclosure, an apparatus includes means for capturing data from a data signal to provide first data captured based on edges in a data clock signal and second data captured based on edges in a phase shifted version of the data clock signal, means for modifying phase difference between the phase shifted version of the data clock signal and the data clock signal, and a controller. The controller is configured to cause the means for modifying phase difference to iteratively increase the phase difference between the phase shifted version of the data clock signal and the data clock signal when the first data initially matches the second data until the first data differs from the second data, cause the means for modifying phase difference to iteratively decrease the phase difference between the phase shifted version of the data clock signal and the data clock signal when the first data initially differs from the second data until the first data matches the second data and determine the margin of the eye opening when the first data begins to match the second data or when the first data begins to differ from the second data. A phase shift between a receive clock signal and the data clock signal remains unchanged until the margin of the eye opening is determined.

In various aspects of the disclosure, a method for identifying margins in an eye opening includes capturing first data from a data signal based on edges in a data clock signal, capturing second data from the data signal responsive to edges in a phase shifted version of the data clock signal, iteratively increasing a phase difference between the phase shifted version of the data clock signal and the data clock signal when the first data initially matches the second data until the first data differs from the second data, and iteratively decreasing the phase difference between the phase shifted version of the data clock signal and the data clock signal when the first data initially differs from the second data until the first data matches the second data. The margin of the eye opening may be determined when the first data begins to match the second data or when the first data begins to differ from the second data. A phase shift between a receive clock signal and the data clock signal remains unchanged until the margin of the eye opening is determined.

In one aspect, the phase shifted version of the data clock signal is initially a quadrature version of the data clock signal.

In certain aspects, the eye opening monitor is included in a serial interface. The processing circuit may be further configured to determine the margin of the eye opening while the serial interface is transferring data during a normal mode of operation. The eye opening monitor may be enabled periodically during the normal mode of operation. The processing circuit may be further configured to modify the phase shift between the receive clock signal and the data clock signal when a change in location of the margin of the eye opening is detected. The eye opening monitor may be enabled when an error is detected in the data transferred during the normal mode of operation.

In certain aspects, the eye opening monitor may additionally include a first phase control circuit that is configured to generate the data clock signal, and a second phase control circuit that responds to an output of the first phase control circuit and that is configured to control the phase difference between the phase shifted version of the data clock signal and the data clock signal. The second phase control circuit may be configured independently of the first phase control circuit.

BRIEF DESCRIPTION OF THE DRAWINGS

FIG. 8 is a flow diagram illustrating an example of a method for equalizing a data signal in accordance with certain aspects of the present disclosure.

DETAILED DESCRIPTION

Figure 1:
FIG. 1 illustrates an example of a system-on-a-chip (SOC) in accordance with certain aspects of the present disclosure.
Figure 1:

The detailed description set forth below in connection with the appended drawings is intended as a description of various configurations and is not intended to represent the only configurations in which the concepts described herein may be practiced. The detailed description includes specific details for the purpose of providing a thorough understanding of various concepts. However, it will be apparent to those skilled in the art that these concepts may be practiced without these specific details. In some instances, well-known structures and components are shown in block diagram form in order to avoid obscuring such concepts.

With reference now to the Figures, several exemplary aspects of the present disclosure are described. The word "exemplary" is used herein to mean "serving as an example, instance, or illustration." Any aspect described herein as "exemplary" is not necessarily to be construed as preferred or advantageous over other aspects.

The terms "computing device" and "mobile device" are used interchangeably herein to refer to any one or all of servers, personal computers, smartphones, cellular telephones, tablet computers, laptop computers, notebooks, ultrabooks, palm-top computers, personal data assistants (PDAs), wireless electronic mail receivers, multimedia Internet-enabled cellular telephones, Global Positioning System (GPS) receivers, wireless gaming controllers, and similar personal electronic devices which include a programmable processor. While the various aspects are particularly useful in mobile devices (e.g., smartphones, laptop computers, etc.), which have limited resources (e.g., processing power, battery, size, etc.), the aspects are generally useful in any computing device that may benefit from improved processor performance and reduced energy consumption.

The term "multicore processor" is used herein to refer to a single integrated circuit (IC) chip or chip package that contains two or more independent processing units or cores (e.g., CPU cores, etc.) configured to read and execute program instructions. The term "multiprocessor" is used herein to refer to a system or device that includes two or more processing units configured to read and execute program instructions.

The term "system on chip" (SoC) is used herein to refer to a single integrated circuit (IC) chip that contains multiple resources and/or processors integrated on a single substrate. A single SoC may contain circuitry for digital, analog, mixed-signal, and radio-frequency functions. A single SoC may also include any number of general purpose and/or specialized processors (digital signal processors (DSPs), modem processors, video processors, etc.), memory blocks (e.g., read only memory (ROM), random access memory (RAM), flash, etc.), and resources (e.g., timers, voltage regulators, oscillators, etc.), any or all of which may be included in one or more cores.

Memory technologies described herein may be suitable for storing instructions, programs, control signals, and/or data for use in or by a computer or other digital electronic device. Any references to terminology and/or technical details related to an individual type of memory, interface, standard, or memory technology are for illustrative purposes only, and not intended to limit the scope of the claims to a particular memory system or technology unless specifically recited in the claim language. Mobile computing device architectures have grown in complexity, and now commonly include multiple processor cores, SoCs, co-processors, functional modules including dedicated processors (e.g., communication modem chips, GPS receivers, etc.), complex memory systems, intricate electrical interconnections (e.g., buses and/or fabrics), and numerous other resources that execute complex and power intensive software applications (e.g., video streaming applications, etc.).

Certain aspects of the disclosure are applicable to input/output (I/O) circuits that provide an interface between core circuits and memory devices. Many mobile devices employ Synchronous Dynamic Random Access Memory (SDRAM), including Low-Power Double Data Rate (DDR) SDRAM, which may be referred to as DDR SDRAM, low-power DDR SDRAM, LPDDR SDRAM or, in some instances, LPDDRx where x describes the technology generation of the LPDDR SDRAM. Later generations of LPDDR SDRAM designed to operate at higher operating frequencies may employ lower voltage levels in the core of an SoC or memory device to mitigate for increased power associated with the higher operating frequencies.

Certain aspects of the disclosure are applicable to circuits that generate, transmit, receive, process and/or propagate differential signals. A differential signal pair comprises two signals that are phase-shifted from each other by 180°. The signals in the differential signal pair may be referred to as complementary signals. The differential signal pair is transmitted over wires, connectors, interconnects or other conductors using voltages of equal voltage magnitude and opposite polarity. A received signal that represents the difference between the differential signal pair can be generated at a receiving device. Common-mode noise affecting wires, connectors, interconnects or other conductors can be expected to induce a near-identical interference signal in the received differential signal pair, and the interference signal is typically cancelled at the receiver and does not affect the received signal.

Process technology employed to manufacture semiconductor devices, including IC devices is continually improving. Process technology includes the manufacturing methods used to make IC devices and defines transistor size, operating voltages and switching speeds. Features that are constituent elements of circuits in an IC device may be referred as technology nodes and/or process nodes. The terms technology node, process node, process technology may be used to characterize a specific semiconductor manufacturing process and corresponding design rules. Faster and more power-efficient technology nodes are being continuously developed through the use of smaller feature size to produce smaller transistors that enable the manufacture of higher-density ICs.

Certain aspects of this disclosure relate to circuits used in a high-speed serializer-deserializer (SERDES) physical layer (PHY) circuits. Certain circuits are described that can be deployed in the analog front-end (AFE) of a receiver. In one example, some aspects of the disclosure relate to decision-feedback equalizers that include a plurality of decision-feedback circuits in parallel with the data input circuit of a receiving device.

FIG. 1 illustrates example components and interconnections in a system-on-chip (SoC) 100 that may be suitable for implementing certain aspects of the present disclosure. The SoC 100 may include a number of heterogeneous processors, such as a central processing unit (CPU) 102, a modem processor 104, a graphics processor 106, and an application processor 108. Each processor 102, 104, 106, 108, may include one or more cores, and each processor/core may perform operations independent of the other processors/cores. The processors 102, 104, 106, 108 may be organized in close proximity to one another (e.g., on a single substrate, die, integrated chip, etc.) so that the processors may operate at a much higher frequency/clock rate than would be possible if the signals were to travel off-chip. The proximity of the cores may also allow for the sharing of on-chip memory and resources (e.g., voltage rails), as well as for more coordinated cooperation between cores.

The SoC 100 may include system components and resources 110 for managing sensor data, analog-to-digital conversions, and/or wireless data transmissions, and for performing other specialized operations (e.g., decoding high-definition video, video processing, etc.). System components and resources 110 may also include components such as voltage regulators, oscillators, phase-locked loops (PLLs), peripheral bridges, data controllers, system controllers, access ports, timers, and/or other similar components used to support the processors and software clients running on the computing device. The system components and resources 110 may also include circuitry for interfacing with peripheral devices, such as cameras, electronic displays, wireless communication devices, external memory chips, etc.

The SoC 100 may further include a Universal Serial Bus (USB) or other serial bus controller 112, one or more memory controllers 114, and a centralized resource manager (CRM) 116. The SoC 100 may also include an input/output module (not illustrated) for communicating with resources external to the SoC, each of which may be shared by two or more of the internal SoC components.

The processors 102, 104, 106, 108 may be interconnected to the USB controller 112, the memory controller 114, system components and resources 110, CRM 116, and/or other system components via an interconnection/bus module 122, which may include an array of reconfigurable logic gates and/or implement a bus architecture. Communications may also be provided by advanced interconnects, such as high-performance networks on chip (NoCs).

The interconnection/bus module 122 may include or provide a bus mastering system configured to grant SoC components (e.g., processors, peripherals, etc.) exclusive control of the bus (e.g., to transfer data in burst mode, block transfer mode, etc.) for a set duration, number of operations, number of bytes, etc. In some cases, the interconnection/bus module 122 may implement an arbitration scheme to prevent multiple master components from attempting to drive the bus simultaneously. The memory controller 114 may be a specialized hardware module configured to manage the flow of data to and from a memory 124 via a memory interface/bus 126.

The memory controller 114 may comprise one or more processors configured to perform read and write operations with the memory 124. Examples of processors include microprocessors, microcontrollers, digital signal processors (DSPs), field programmable gate arrays (FPGAs), programmable logic devices (PLDs), state machines, gated logic, discrete hardware circuits, and other suitable hardware configured to perform the various functionality described throughout this disclosure. In certain aspects, the memory 124 may be part of the SoC 100.

Figure 2:
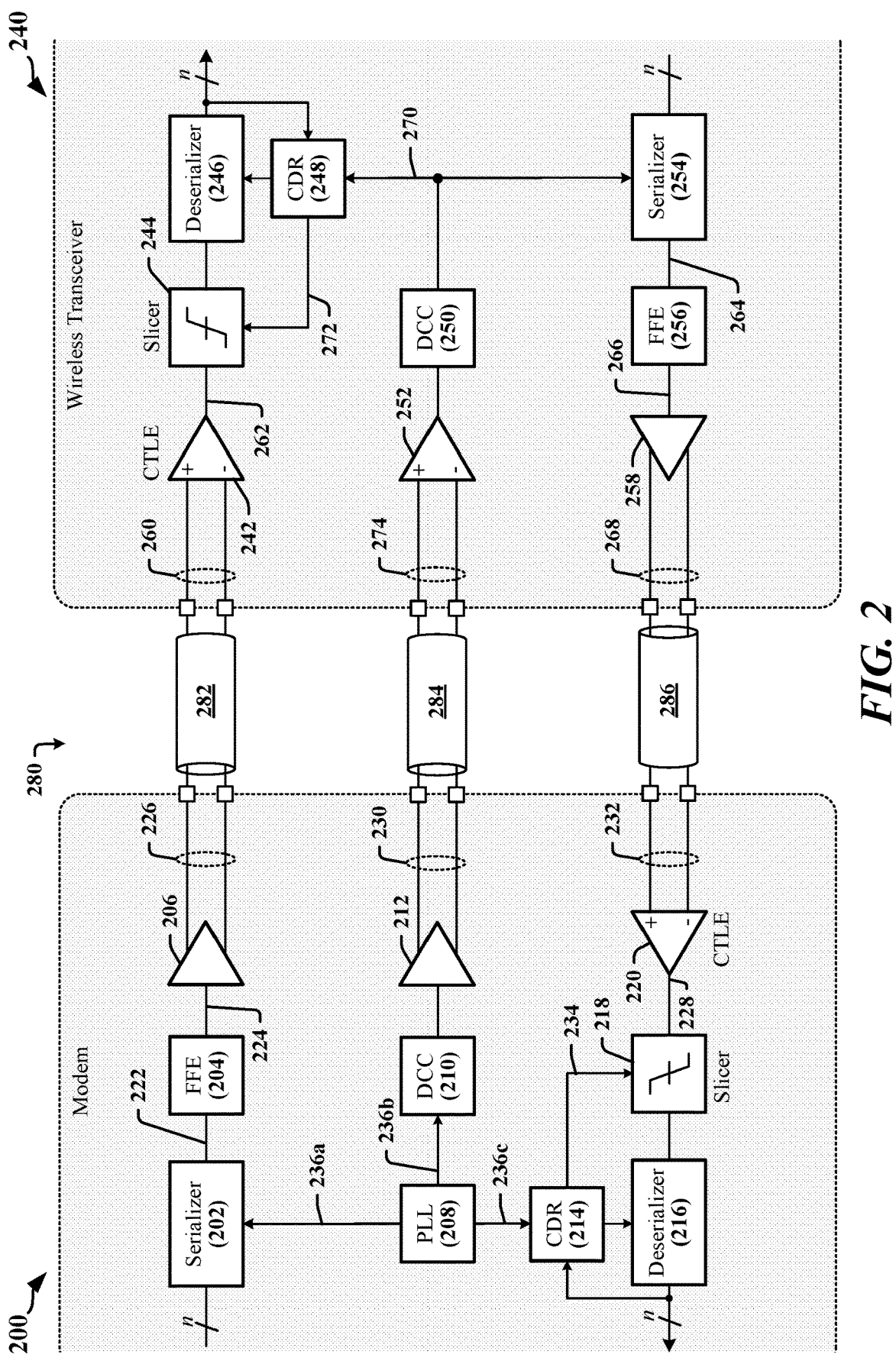
FIG. 2 illustrates an example of a system that employs a multi-channel data communication link.

FIG. 2 illustrates an example of a system that employs a multi-channel data communication link 280 to couple a modem 200 with a wireless transceiver 240. The data communication link 280 employs a clock forwarding architecture in which a clock signal is transmitted to provide timing information at the receiver. The illustrated data communication link 280 includes data channels 282 and 286 and a clock channel 284 that provide a transmission medium through which signals propagate between devices. In the illustrated example, a modem 200 transmits data in a first signal over a first data channel 282 to a wireless transceiver 240 and receives data in a second signal transmitted over a second data channel 286. Data signals are transmitted over the data channels 282 and 286 in accordance with timing information provided by a bus clock signal 230 transmitted over the clock channel 284.

The modem 200 may include a serializer 202 configured to convert n-bit parallel data elements, bytes or words into a serial data stream for transmission in a transmit data signal 222 over the first data channel 282. The transmit data signal 222 may be preconditioned by a pre-equalizing circuit, such as the illustrated digital feed-forward equalizer (the FFE 204), in order to combat or compensate for signal distortions attributable to inter-symbol interference (ISI), reflection and other effects that can be expected to limit bandwidth in first data channel 282. The preconditioned transmit data signal 224 output by the FFE 204 is provided to a driver circuit 206 that is configured drive the first data channel 282.

The modem 200 may include a serializer 202 configured to convert n-bit parallel data elements, bytes or words into a serial data stream for transmission in a serialized data signal 222. The serialized data signal 222 may be preconditioned by a pre-equalizing circuit, such as the illustrated digital feed-forward equalizer (the FFE 204), in order to combat or compensate for signal distortions attributable to inter-symbol interference (ISI), reflection and other effects that can be expected to limit bandwidth in the first data channel 282. A preconditioned data signal 224 output by the FFE 204 is provided to a driver circuit 206 that is configured generate and transmit a differential transmit data signal 226 over the first data channel 282.

The wireless transceiver 240 can be configured to process a data signal 260 received over the first data channel 282. The data signal 260 may be provided to a differential receiver 242, which may include or cooperate with an equalizing circuit. In one example, continuous time linear equalization (CTLE) may be used to compensate for certain losses experienced in the first data channel 282. The first data channel 282 may be characterized in some respects as a low-pass filter. In the illustrated example, the differential receiver 242 outputs an equalized data signal 262 that is sampled by a slicer 244. The slicer 244 may be implemented using a D-flipflop or the like and may be configured to capture signaling state of the equalized data signal 262 under the control of edges in a sampling clock signal 272 generated by a clock and data recovery circuit (the CDR circuit 248). The output of the slicer 244 may be provided to a deserializer 246 that is clocked in accordance with one or more clock signals provided by the CDR circuit 248. The CDR circuit 248 may be configured to delay or phase shift a receiver clock signal 270 to ensure that edges in the sampling clock signal 272 are timed to optimize sampling reliability. Additional phases of the receiver clock signal 270 may be generated by the CDR circuit 248 or another circuit to obtain in-phase and quadrature (I/Q) versions of the clock signal to be used by the slicer 244 and/or the deserializer 246. A quadrature signal has phase that is shifted by 90° with respect to an in-phase signal.

In the illustrated wireless transceiver 240, the receiver clock signal 270 is derived from a received bus clock signal 274 over the clock channel 284. A differential receiver 252 coupled to the clock channel 284 may be configured to equalize the received bus clock signal 274, and a duty cycle correction circuit 250 may be used to adjust the duty cycle of the receiver clock signal 270. The receiver clock signal 270 is provided to a serializer 254 that is configured to convert n-bit parallel data elements, bytes or words into a serial data stream for transmission in a serialized data signal 264. The serialized data signal 264 may be preconditioned by a pre-equalizing circuit, such as the illustrated FFE 256, in order to combat or compensate for signal distortions attributable to ISI, reflection and other effects that can be expected to limit bandwidth in the second data channel 286. A preconditioned data signal 266 output by the FFE 256 is provided to a driver circuit 258 that is configured generate and transmit a differential transmit data signal 268 over the second data channel 286.

The illustrated modem 200 can be configured to process a data signal 232 received over the second data channel 286. The data signal 232 may be provided to a differential receiver 220, which may include or cooperate with an equalizing circuit. In one example, CTLE may be used to compensate for certain losses experienced in the second data channel 286. The second data channel 286 may be characterized in some respects as a low-pass filter. In the illustrated example, the differential receiver 220 outputs an equalized data signal 228 that is sampled by a slicer 218. The slicer 218 may be implemented using a D-flipflop or the like and may be configured to capture signaling state of the equalized data signal 228 under the control of edges in a sampling clock signal 234 generated by a CDR circuit 214. The output of the slicer 218 may be provided to a deserializer 216 that is clocked in accordance with one or more clock signals provided by the CDR circuit 214. The CDR circuit 214 may be configured to delay or phase shift a transmitter clock signal to ensure that edges in the sampling clock signal 234 are timed to optimize sampling reliability.

A clock generation circuit, including the illustrated phase locked loop 208, may generate multiple clock signals 236a, 236b, 236c used by the modem 200. One or more of the clock signals 236a, 236b, 236c may be a divided version of a base clock signal generated by the PLL 208. One or more of the clock signals 236a, 236b, 236c may be phase shifted with respect to the base clock signal. In one example, the serializer 202 may produce the serialized data signal 222 using timing provided by a first clock signal 236a. In another example, the bus clock signal 230 transmitted over the clock channel 284 may be derived from a second clock signal 236b. In some instances, a duty cycle correction circuit 210 may be used to adjust the duty cycle of the second clock signal 236b and to provide an input to a driver circuit 212 that is configured drive the clock channel 284. In another example, the CDR circuit 248 may generate the sampling clock signal 234 from a third clock signal 236c.

In high-speed applications, data throughput of a serial data link may be limited by the characteristics of the channel used to carry data signals. Impedance mismatches, parasitic electromagnetic coupling and other factors can cause signal distortion. In many implementations, equalization circuits and capabilities are included in I/O circuits to compensate for signal distortions attributable to inter-symbol interference (ISI) and other effects that can combine to limit bandwidth in a channel. ISI can result when a first-received symbol interferes with subsequently received symbols due to reflections, frequency-dependent delays and other imperfections in the channel. A symbol may refer to signaling state within a unit interval (UI), or symbol interval, in which data is modulated or encoded in the waveform of a transmitted signal. In some instances, a DFE may be implemented in the receiver. The DFE is a nonlinear equalizer that can be configured to flatten channel response and limit signal distortion without introducing noise or crosstalk that can occur with equalizers that operate using amplification of received signals.

Figure 3:
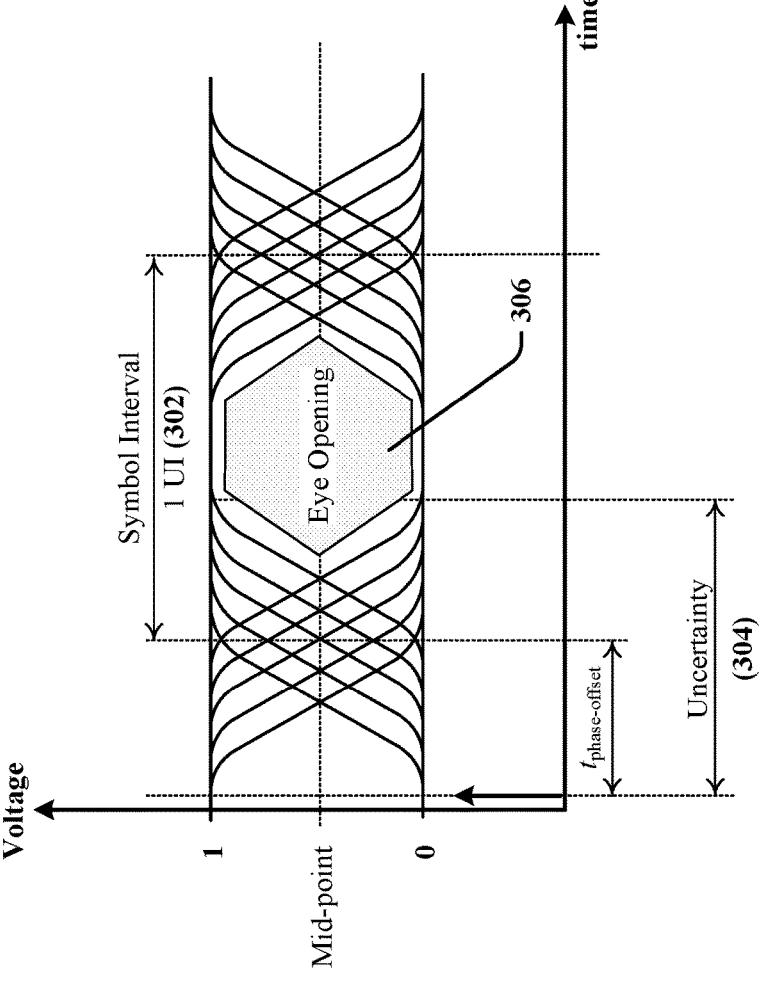
FIG. 3 illustrates an eye diagram that is generated as an overlay of multiple symbol intervals.
Figure 3:

FIG. 3 illustrates an eye diagram 300 generated as an overlay of multiple symbol intervals onto a single symbol interval 302. A signal transition region 304 represents a time period of uncertainty at the boundary between two symbols where variable signal rise times prevent reliable decoding. State information may be determined reliably in a region defined by an eye opening 306 that represents the time period in which the symbol is stable and can be reliably received and decoded. In one example, the eye opening 306 may define a region in which mid-point crossings or other threshold do not occur and a receiver or decoder can reliably sample, demodulate or decode information from a data signal in the symbol interval 302. The eye opening 306 may be narrowed along the time axis by ISI, reflections, increases in data rate, and for other reasons. The eye opening 306 may be compressed in the voltage axis by ISI and other types of interference and distortion.

The concept of periodic sampling and the representation of the signal using an eye diagram can be useful during design, adaptation and configuration of systems which use a clock and data recovery (CDR) circuit that processes a received data-timing signal or that generates a data-timing signal based on frequent transitions appearing in the received data signal. A communication system based on serializer-deserializer (SERDES) technology is an example of a system where an eye opening 306 in an eye diagram 300 can be utilized as a basis for judging the ability to reliably recover data. An eye-opening monitor (EOM) may be employed to indicate end-to-end electrical performance margins associated with a communication channel. The EOM may enable the calibration of circuits needed to ensure reliable sampling of a data signal. In some implementations, the EOM may be implemented using circuits that can indicate when the voltage in a channel is sufficiently higher or lower than the mid-point voltage level or sufficiently higher or lower than one or more threshold voltage levels.

EOMs are commonly used in wireline communication interfaces that use a clock forwarding architecture, including DDR interfaces and high-speed serial communication interfaces. An EOM may be used for link training and for defining proper sampling phase angles for clock signals used in a receiving device. Typically, the clock frequency is known and used to define the UI employed by the EOM. The clock frequency can be derived directly from the clock channel in a clock forwarding implementation and/or may be determined by a CDR. The EOM may produce information that can be used to adjust phase of one or more clock signals used for sampling a received data signal.

Figure 4:
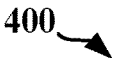
FIG. 4 illustrates an example of a circuit that can implement an eye opening monitor.
Figure 4:
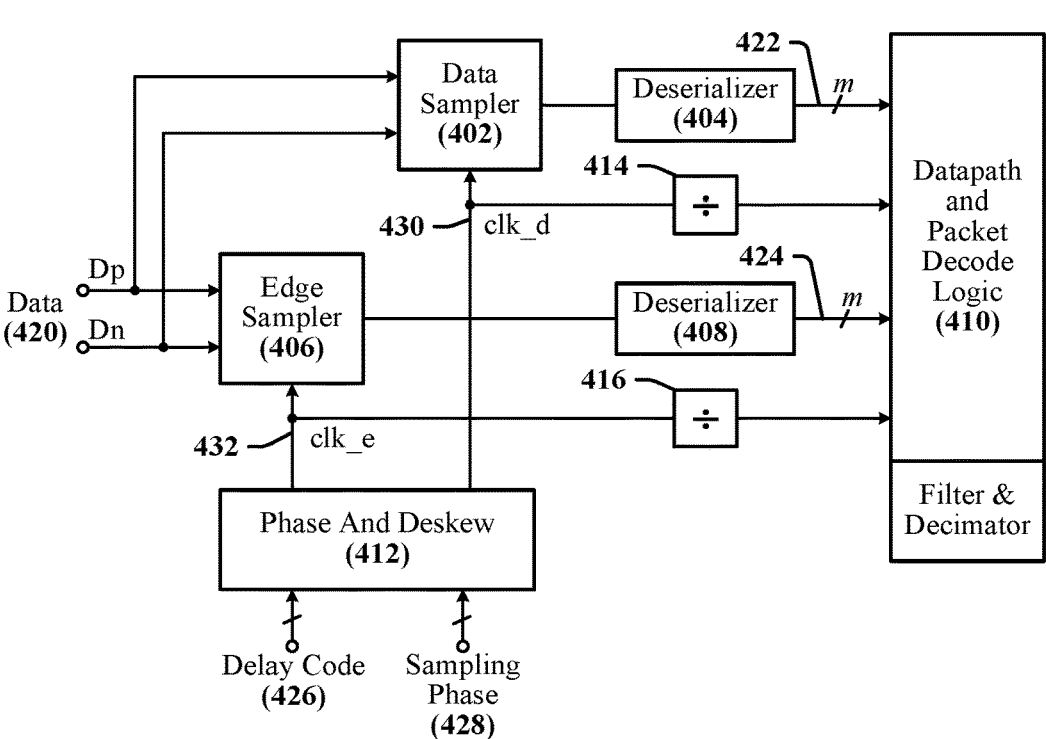
Figure 4:
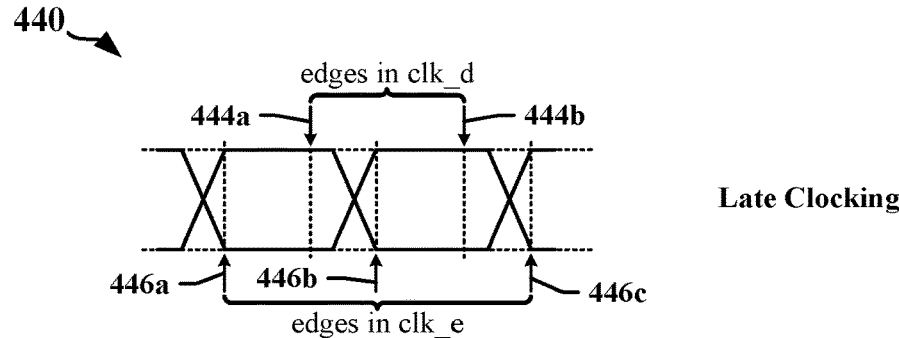
Figure 4:
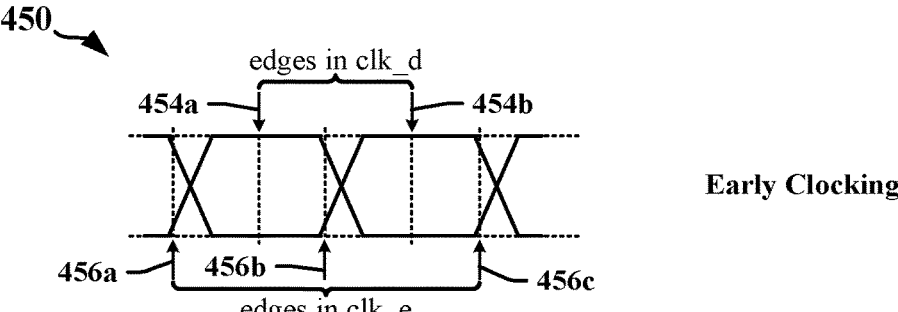

FIG. 4 illustrates an example of a circuit 400 that can implement an EOM. A differential data signal 420 is provided to a first sampler circuit (the data sampler 402) that responds to edges in a first sampling clock signal (the clk_d signal 430). In one example, the data sampler 402 responds to edges in the clk_d signal 430 that correspond to transitions from a low signaling state to a high signaling state. The clk_d signal 430 is generated by phase and deskew logic 412 that establishes a desired phase shift between the data signal 420 and the clk_d signal 430 to ensure that the data signal 420 is stable when sampled. In some instances, the desired phase shift between the data signal 420 and the clk_d signal 430 can be obtained by controlling the phase shift between the clk_d signal 430 and a clock signal that is received over a communication link or that is derived by a CDR circuit from the data signal 420.

In one example, the phase and deskew logic 412 includes a CDR circuit, phase mixing circuit and/or phase interpolator that provide and configure the edges in the clk_d signal 430 near the center of the eye opening. The phase and deskew logic 412 may be initially configured to generate the clk_d signal 430 by phase shifting a clock signal received from a clock channel. Data captured by the data sampler 402 is provided to a deserializer 404, which produces an m-bit unit of data (the data word 422). The deserializer 404 and data path and packet decode logic 410 use timing information provided by a clock divider 414 that typically divides the clk_d signal 430 by m when the deserializer 404 produces m-bit data words 422. In a normal operation the data word 422 is processed by the data path and packet decode logic 410.

In training or calibration modes of operation, the data word 422 derived from the data sampler 402 may be compared with a data word 422 derived from a second sampler circuit (the edge sampler 406). The edge sampler 406 responds to edges in a second sampling clock signal (the clk_e signal 432). The edges in the clk_e signal 432 may correspond to transitions from a low signaling state to a high signaling state. The clk_e signal 432 is generated by the phase and deskew logic 412. Data captured by the edge sampler 406 is provided to a deserializer 408, which produces an m-bit unit of data (the edge word 424). The deserializer 408 and the data path and packet decode logic 410 use timing information provided by a clock divider 416 that divides the clk_e signal 432 by m when the deserializer 408 produces m-bit edge words 424.

The EOM attempts to discover the margins of the eye opening using the clk_e signal 432 and the data produced by the edge sampler 406. The phase and deskew logic 412 may be configured to establish a 90° phase shift between the clk_d signal 430 and the clk_e signal 432. The EOM probes the margins of the eye opening by causing the phase and deskew logic 412 to modify the phase of the clk_d signal 430 with respect to an input sampling clock signal (the sampling phase 428), while maintaining the 90° phase shift between the clk_d signal 430 and the clk_e signal 432. The sampling phase 428 may be generated by a CDR using a clock signal that is received over a communication link and/or based on timing of transitions in the data signal 420. When the data produced by the edge sampler 406 initially matches the data produced by the data sampler 402, the phase and deskew logic 412 may apply an increasing phase shift to the clk_d signal 430 and the clk_e signal 432 until the data produced by the edge sampler 406 does not match the data produced by the data sampler 402, indicating that edges in the clk_e signal 432 are located in the margin of the eye opening and thereby identifying the location of the margin of the eye opening. When the data produced by the edge sampler 406 does not initially match the data produced by the data sampler 402, the phase and deskew logic 412 may apply an increasing phase shift to the clk_d signal 430 and the clk_e signal 432 until the data produced by the edge sampler 406 matches the data produced by the data sampler 402, indicating that edges in the clk_e signal 432 are located within the eye opening and thereby identifying the location of the margin of the eye opening. The phase and deskew logic 412 maintains the quadrature relationship between the clk_d signal 430 and the clk_e signal 432 during calibration.

The phase and deskew logic 412 may be configured to provide edges in the clk_d signal 430 that occur at the center of the eye opening or as close as possible to the center of the eye opening. The comparison of data words 422 and edge words 424 or the comparison of samples produced by the data sampler 402 and edge sampler 406 can indicate if the data sample are captured early or late within the eye opening. The timing diagram 440 illustrates an example in which the edges 444a, 444b in the clk_d signal 430 used to sample the data signal are late, such that sampling occurs after the midpoint of the eye opening. In this first example, edges 446a, 446b, 446c in the clk_e signal 432 occur at the end of the transition region and lie outside the eye opening. The phase and deskew logic 412 may apply an increasingly negative phase shift to the clk_d signal 430 and the clk_e signal 432. The timing diagram 450 illustrates an example in which the edges 454a, 454b in the clk_d signal 430 used to sample the data signal are early, such that sampling occurs before the midpoint of the eye opening. In this second example, edges 456a, 456b, 456c in the clk_e signal 432 occur at the beginning of the transition region. Data captured based on the timing of the clk_e signal 432 illustrated for the second example does not reliably match the data captured based on the timing of the clk_d signal 430. The phase and deskew logic 412 may apply an increasingly positive phase shift to the clk_d signal 430 and the clk_e signal 432.

The EOM may be included in a closed loop with the CDR during calibration to enable data and edge sample timing to be corrected toward nominal timing. In some instances, the phase relationships between an input sampling clock signal (the sampling phase 428) and the clk_d signal 430 and/or the clk_e signal 432 may be changed to adjust the timing of edges and to find nominal or optimal timing for sampling circuits. In one example, the nominal or optimal sampling timing is obtained when the clk_d signal 430 and/or the clk_e signal 432 have a quadrature relationship (I-Q) such that edges in the clk_d signal 430 occur at or the center of the eye opening and edges in the clk_e signal 432 occur at the beginning or end of the eye opening.

Calibration may be terminated when the CDR is locked. The CDR may be locked when the phase relationships between the sampling phase 428, the clk_d signal 430 and the clk_e signal 432 have been calibrated. In one example, a delay code 426 provided to the phase and deskew logic 412 may be fixed when the calibration is terminated. The delay code 426 may be provided in a multibit signal and may be used to configure the phase shifts applied to the sampling phase 428 in order to generate the clk_d signal 430 and the clk_e signal 432. In conventional systems, only the data sampler 402 and associated data sampling paths are active after CDR lock to save power. The CDR operates in an open loop mode when the edge sampler 406 is disabled and the relative phase relationship between input data and sampling clock may be modulated by environmental changes when the CDR is in the open loop mode. The data sampler 402 is configured to capture data during normal operations occurring after CDR lock. Accordingly, conventional systems typically retrain the CDR periodically to adjust for changes in the phase relationship between the data signal, the clk_d signal 430 and the clk_e signal 432.

Certain aspects of the present disclosure enable a dynamic EOM to be used when a communication channel is active and operating normally. The EOM can determine configuration and timing of margins in an eye opening using real traffic during normal operations. In certain implementations, the EOM obtains additional samples of a data signal using a sampling clock that has a variable phase relationship with the clock signal use to capture data for deserialization. In one example, the EOM compares samples obtained using a clock signal with controlled skewed phase difference with real time data samples to determine whether the skewed phase sample is identical to real time data sample. The EOM can determine the boundaries of the eye opening by performing a controlled sweep of the phase used to capture skewed samples.

An EOM implemented in accordance with certain aspects of this disclosure can be employed for lane training and initial margin detection. An EOM implemented in accordance with certain aspects of this disclosure can be used for periodic monitoring to determine whether the phase of data sampling clock signals should be adjusted. In some implementations, the EOM can be used for link debug during real time operation without modifying interface software. In some instances, a CDR circuit may be adapted to provide versions of sampling clock signals with controlled skew. In some instances, phase shifting circuits may be adapted to added to provide versions of sampling clock signals with controlled skew.

Figure 5:
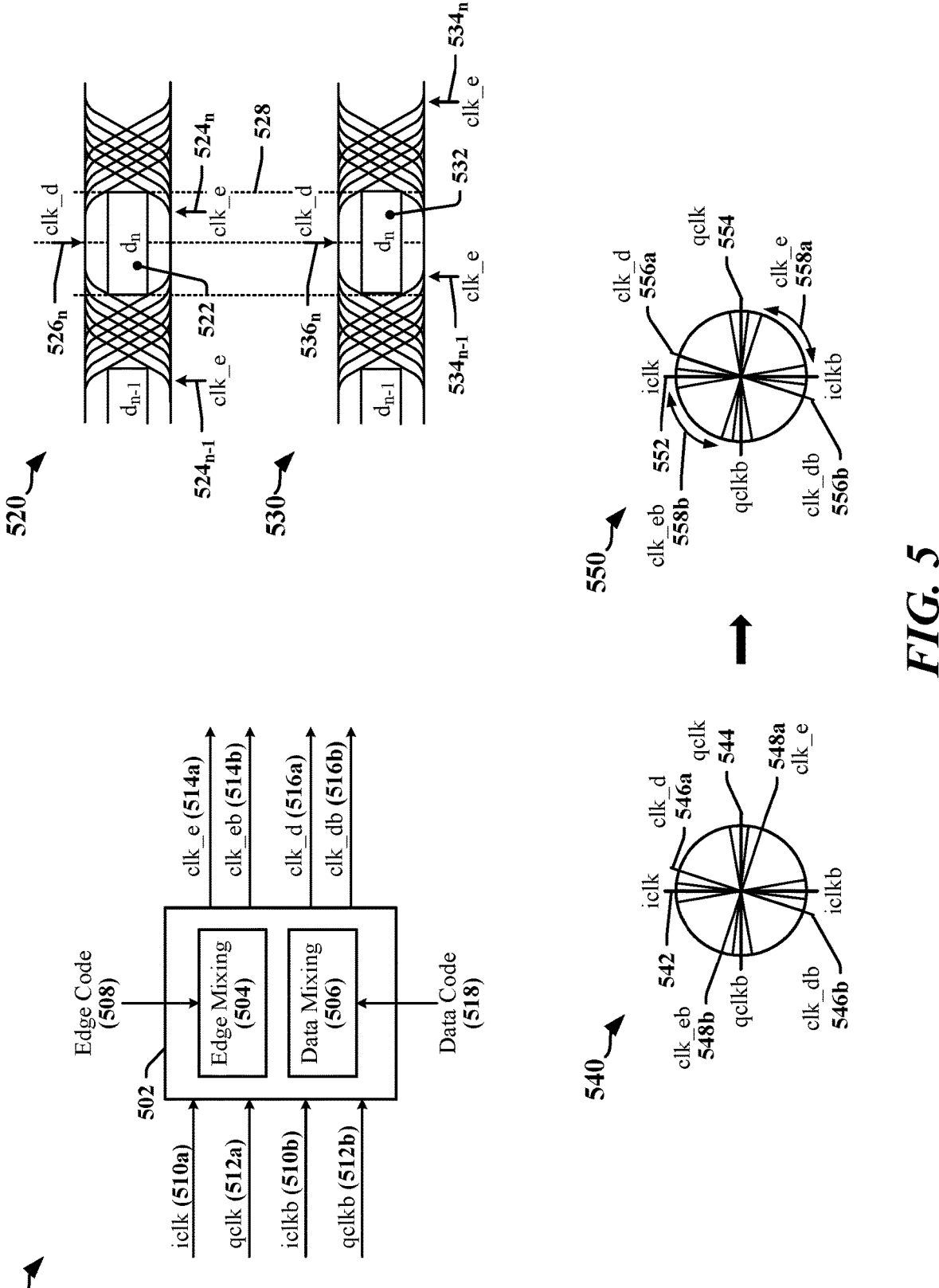
FIG. 5 illustrates a phase control circuit that can support a dynamic eye opening monitor that is configured in accordance with certain aspects of this disclosure.

FIG. 5 illustrates a phase control circuit 500 that can support a dynamic EOM monitor that is configured in accordance with certain aspects of this disclosure. The phase control circuit 500 may replace or augment the phase and deskew logic 412 illustrated in FIG. 4. The phase control circuit 500 receives an in-phase version of a differential receive clock signal and a quadrature version of the differential version of the receive clock signal. The in-phase version of the differential receive clock signal includes a pair of complementary signals (the iclk signal 510*a* and the iclkb signal 510*b*). The quadrature version of the differential receive clock signal includes a pair of complementary signals (the qclk signal 512*a* and the qclkb signal 512*b*). The in-phase and quadrature versions of the receive clock signal are provided to a pair of phase mixing circuits. A phase mixing circuit may generate output signals with phases that are determined by proportionate addition of the iclk signal 510*a*, the iclkb signal 510*b*, the qclk signal 512*a* and the qclkb signal 512*b*. In one example, an output signal that is phase shifted by 45° from the iclk signal 510*a* may be obtained by mixing (i.e., adding) the iclk signal 510*a* and the qclk signal 512*a* using equal weights. The weighting factors may be determined by multibit codes provided in an edge code signal 508 provided to an edge mixing circuit 504, and in a data code signal 518 provided to a data mixing circuit 506.

The edge mixing circuit 504 may be used to generate a differential edge sampling signal (the clk_e signal 514*a* and the clk_eb signal 514*b*) and the data mixing circuit 506 may be used to generate a differential data sampling signal (the clk_d signal 516*a* the clk_db signal 516*b*). In one example, the clk_e signal 514*a* and the clk_eb signal 514*b* may be provided to an edge sampler 406, while the clk_d signal 514*a* and the clk_eb signal 514*b* may be provided to a data sampler 402.

In a phase control circuit 500 provided in accordance with certain aspects of this disclosure, the edge mixing circuit 504 and the data mixing circuit 506 may be configured independently. A dynamic EOM monitor may determine the margins of an eye opening by iteratively adjusting the phase of the edge sampling signal while maintaining the phase of the data sampling signal unchanged with respect to a timing signal received over a clock channel or generated by the CDR. The phase of the data sampling signal may be initially configured using conventional techniques to find the center or approximate center of the eye opening. In one example, the edge sampling signal may be a quadrature version of the data sampling signal. In some instances, the CDR may lock the phase of the data sampling signal.

In some instances, the phase control circuit 500 may sweep the edge sampling point toward the data sampling point. In other instances, the phase control circuit 500 may sweep the edge sampling point away from the data sampling point. Sweeping the edge sampling point may include iteratively adjusting the phase of the edge sampling signal while maintaining the phase of the data sampling signal constant. For the purposes of this description, an example is used in which the phase of the data sampling signal and the phase of the edge sampling signal may be defined or determined with respect to the differential receive clock.

With reference to the first example eye diagram 520 illustrated in FIG. 5, the data sampling point 526$_n$ is located at the nominal center of the eye opening 522 for a data bit (d$_n$), while the corresponding edge sampling point 524$_n$ is located at the edge of the same eye opening 522. In this example, the data sampled at the data sampling point 526$_n$ can be expected to match the data sampled at the edge sampling point 524$_n$. The EOM may recognize that both sampling points 524$_n$ and 526$_n$ lie within the eye opening 522. The EOM may cause the phase difference between the edge sampling signal and the data sampling signal to increase in order to move the edge sampling point 524$_n$ while maintaining the position of the data sampling point 526$_n$. At some point, the data sampled at the edge sampling point 524$_n$ no longer matches the data sampled at the data sampling point 526$_n$, indicating that the right eye margin 528 has been located.

With reference to the second example eye diagram 530 illustrated in FIG. 5, the data sampling point 536$_n$ is located at the nominal center of the eye opening 532 for a data bit (d$_n$), while the corresponding edge sampling point 534$_n$ is located at the edge of the eye opening for the next data bit. In this example, the data sampled at the data sampling point 536$_n$ may be expected to differ from the data sampled at the edge sampling point 534$_n$ for a sequence of data bits that includes both a binary '1' and a binary '0'. The EOM may cause the phase difference between the edge sampling signal and the data sampling signal to decrease in order to move the edge sampling point 534$_n$ while maintaining the position of the data sampling point 536$_n$. At some point, the data sampled at the edge sampling point 534$_n$ matches the data sampled at the data sampling point 536$_n$, indicating that the right eye margin 528 has been located.

The phase diagrams 540 and 550 provided in FIG. 5 illustrate certain aspects of the operation of a dynamic EOM that is adapted or configured in accordance with certain aspects of this disclosure. The first phase diagram 540 illustrates initial phase relationships between the receive clock signal, which is provided as a differential in-phase version (including the iclk phase 542) and a differential quadrature version (including the qclk phase 544). The data sampling signal is represented in the first phase diagram 540 by a pair of complementary phases including the clk_d phase 546a and the clk_db phase 546b. The edge sampling signal is a quadrature version of the data sampling signal and is represented in the first phase diagram 540 by a pair of complementary phases including the clk_e phase 548a and the clk_eb phase 548b.

The dynamic EOM may initiate a sweep of the phase of the edge sampling signal to identify eye margins, as illustrated by the second phase diagram 550. In the second phase diagram 550 the receive clock signal is provided as a differential in-phase version (including the iclk phase 552) and a differential quadrature version (including the qclk phase 554). The data sampling signal is represented in the second phase diagram 550 by a pair of complementary phases including the clk_d phase 556a and the clk_db phase 556b. The edge sampling signal does not have a fixed phase relationship with the data sampling signal when the dynamic EOM is actively identifying eye margins. The edge sampling signal is represented in the second phase diagram 550 by a pair of complementary phases including the clk_e phase 558a and the clk_eb phase 558b.

A dynamic EOM configured in accordance with this disclosure can be used during link training and debugging. The EOM may operate when a training pattern is transmitted over a data channel. An EOM configured in accordance with this disclosure can establish or reconstruct information related to configuration and timing of margins in an eye opening using data streams that are transmitted as part of real traffic during normal link operations. The dynamic EOM may need to reacquire eye opening information after channel conditions are altered due to electromagnetic interference, temperature or voltage variations, and/or other environmental conditions or events. A conventional EOM can be used to reestablish timing relationships after a link failure when training patterns in accordance with protocol-defined training procedures that may be initiated after a failed or degraded communication link has been detected. Conventional EOMs cannot operate when the communication channel is used for real traffic during normal operations.

A dynamic EOM configured in accordance with this disclosure can prevent degradation and/or failure of the communication link by incrementally or periodically updating eye opening information using data streams that are transmitted as part of real traffic during normal link operations. The presently disclosed EOM can be implemented without significantly affecting power budgets defined for the communication interface by disabling the capture of additional samples of the real time data signal.

When activated periodically or after a link error, a dynamic EOM configured in accordance with this disclosure may enable edge sampling circuits and begin to sweep the phase of the edge sampling signal with respect to an established data sampling signal. The dynamic EOM can determine the location of the eye margins and move the data sampling point by causing the phase of the data sampling signal to be modified based on the phase of the edge sampling signal at one or more margins of the eye opening.

Figure 6:
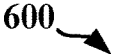
FIG. 6 illustrates an example of an auxiliary phase shifting circuit in accordance with certain aspects of this disclosure.
Figure 6:
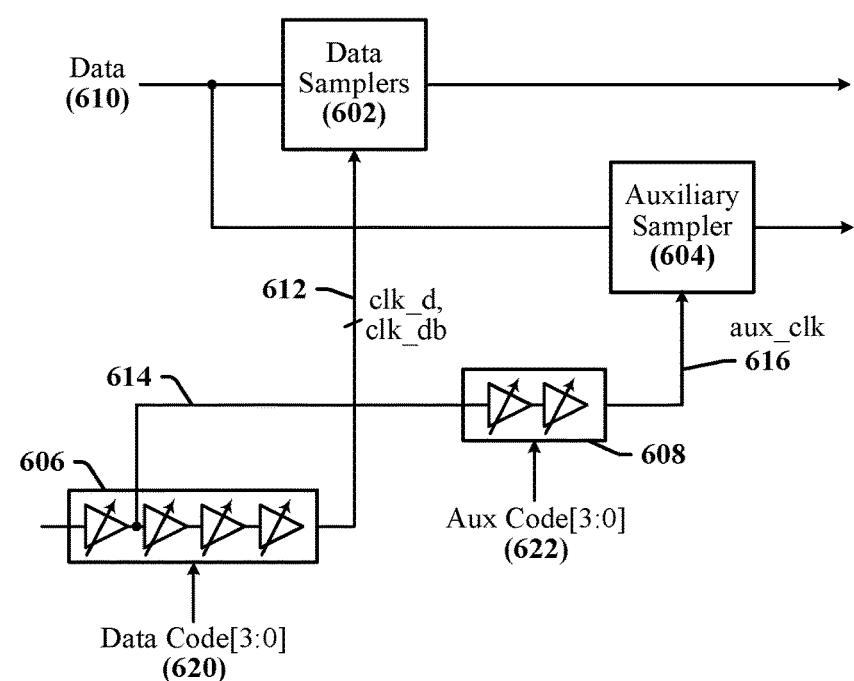
Figure 6:
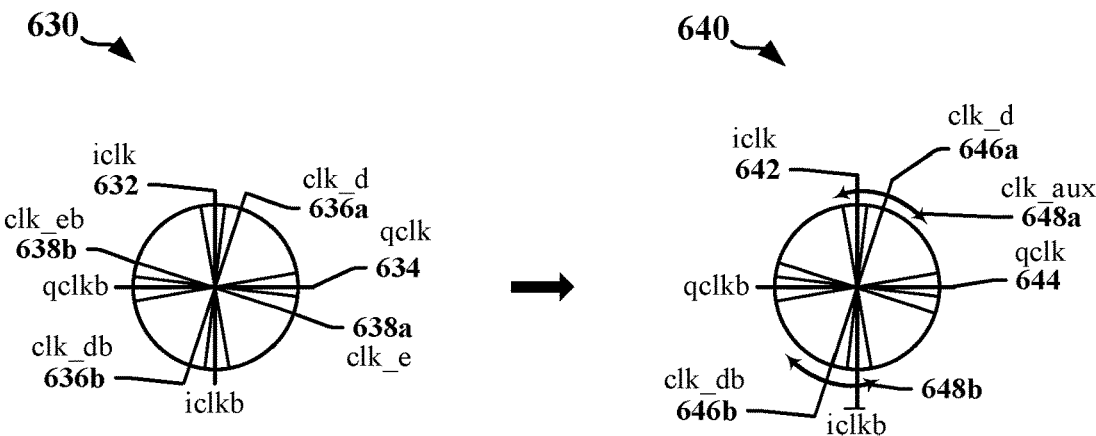

FIG. 6 illustrates an example of an auxiliary phase shifting circuit 600 that may be included in a CDR, phase and deskew logic or other circuits in an interface that has been adapted or configured to implement a dynamic EOM in accordance with certain aspects of this disclosure. A data signal 610 is provided to one or more data sampler circuits (the data samplers 602) that respond to edges in a data sampling clock signal 612. The data sampling clock signal 612 may be a differential signal and may include the complementary clk_d and clk_db signals. The data sampling clock signal 612 may be generated by phase and deskew logic 606 that establishes a desired phase shift between the data signal 610 and the data sampling clock signal 612 to ensure that the data signal 610 is stable when sampled. In one example, the phase and deskew logic 606 includes a phase interpolator or phase mixer. In another example, the phase and deskew logic 606 is implemented as a configurable multi-tap delay line. The phase and deskew logic 606 may be initially configured to generate the data sampling clock signal 612 by phase shifting a clock signal received from a clock channel based on a multibit data code 620 received in a control signal.

Data captured by the data sampler 602 may be compared to data captured by an auxiliary sampler 604. The auxiliary sampler 604 responds to edges in an auxiliary sampling clock signal (the aux_clk signal 616). The aux_clk signal 616 is generated by auxiliary phase and deskew logic 608. In one example, the auxiliary phase and deskew logic 608 includes a phase interpolator or phase mixer. In another example, the auxiliary phase and deskew logic 608 is implemented as a configurable multi-tap delay line. The auxiliary phase and deskew logic 608 may be configured to generate the aux_clk signal 616 by phase shifting an output 614 of the phase and deskew logic 606 based on a multibit data code 622 received in a control signal.

The dynamic EOM can discover the margins of the eye opening using training data transmitted during training modes of operation or real data that is transmitted during normal modes of operation. The dynamic EOM may sweep the phase shift of the aux_clk signal 616 while comparing data captured by the data sampler 602 to data captured by the auxiliary sampler 604. Sampling edges in the sampling clock signal 612 and sampling edges in the aux_clk signal 616 may be determined to be within the same eye opening provided the data captured by the data sampler 602 consistently matches data captured by the auxiliary sampler 604. The sampling edges in the aux_clk signal 616 may be determined to have crossed a margin of the eye opening when data captured by the data sampler 602 does not match data captured by the auxiliary sampler 604. Similarly, the sampling edges in the aux_clk signal 616 may be determined to have crossed an eye margin into the eye opening when data captured by the data sampler 602 consistently matches data captured by the auxiliary sampler 604 after mismatches have been observed.

The phase diagrams 630 and 640 provided in FIG. 6 illustrate certain aspects of the operation of a dynamic EOM that employ auxiliary phase and deskew logic 608 in accordance with certain aspects of this disclosure. The first phase diagram 630 illustrates the initial phase relationships between the receive clock signal, which is provided as a differential in-phase version (including the iclk phase 632) and a differential quadrature version (including the qclk phase 634). The data sampling signal is represented in the first phase diagram 630 by a pair of complementary phases including the clk_d phase 636a and the clk_db phase 636b. The auxiliary sampling clock signal is a quadrature version of the data sampling signal and is represented in the first phase diagram 630 by a pair of complementary phases including the clk_e phase 638a and the clk_eb phase 638b.

The dynamic EOM may initiate a sweep of the phase of the edge sampling signal to identify eye margins, as illustrated by the second phase diagram 640. In the second phase diagram 640 the receive clock signal is provided as a differential in-phase version (including the iclk phase 642) and a differential quadrature version (including the qclk phase 644). The data sampling signal is represented in the second phase diagram 640 by a pair of complementary phases including the clk_d phase 646a and the clk_db phase 646b. The auxiliary sampling clock signal does not have a fixed phase relationship with the data sampling signal when the dynamic EOM is actively identifying eye margins. The edge sampling signal is represented in the second phase diagram 640 by a pair of complementary phases including the clk_e phase 648a and the clk_eb phase 648b.

Figure 7:
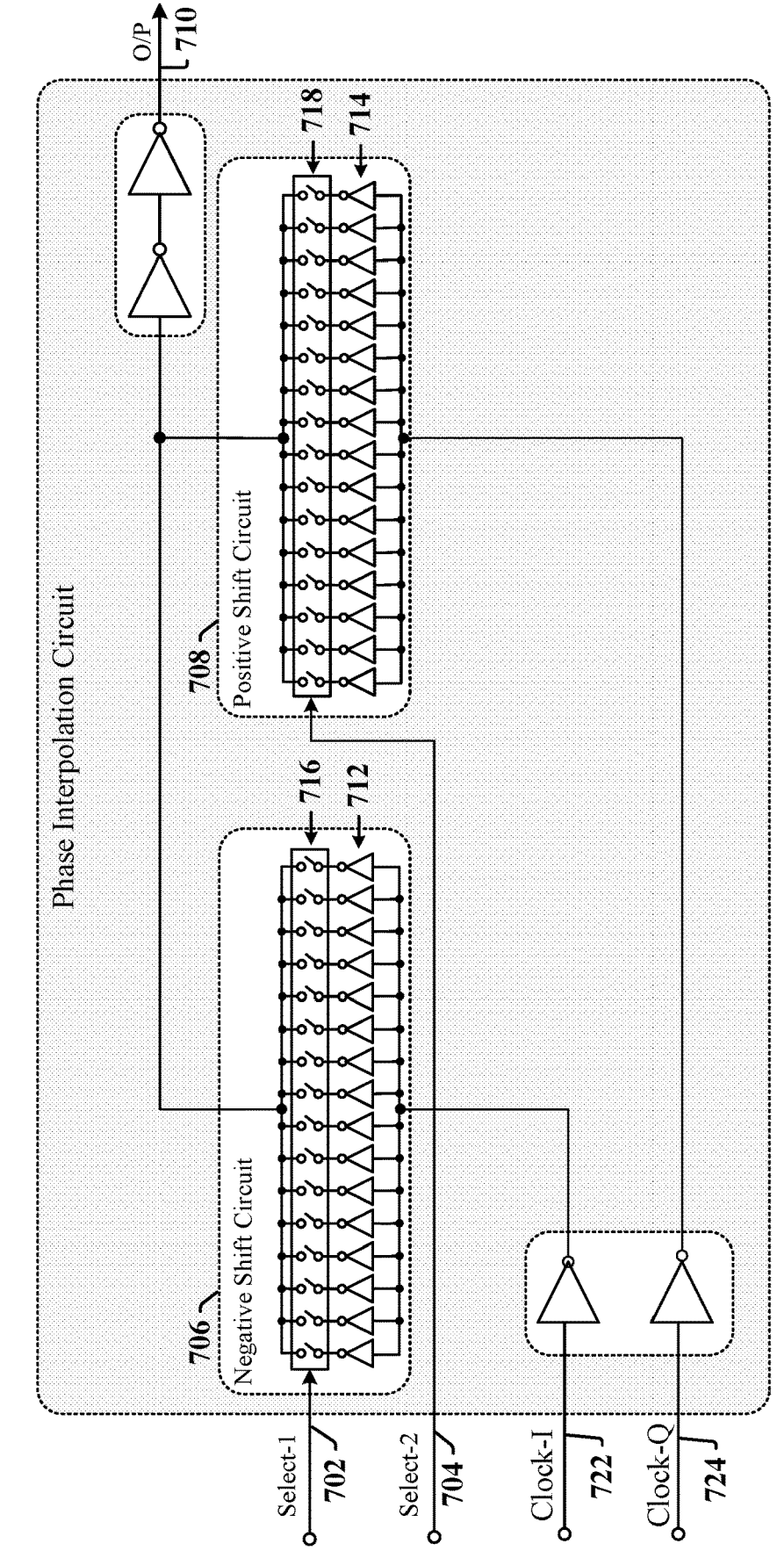
FIG. 7 illustrates an example of a phase mixing circuit configured in accordance with certain aspects of this disclosure.

FIG. 7 illustrates an example of a phase mixing circuit 700 that can be used to implement the edge mixing circuit 504 and the data mixing circuit 506 illustrated in FIG. 5. The phase mixing circuit 700 may also be referred to as a phase rotating circuit. In the illustrated example, the phase mixing circuit 700 receives an in-phase version of a clock signal (the Clock-I signal 722) and a quadrature version of the clock signal (the Clock-Q signal 724). The Clock-I signal 722 is provided to a negative shift circuit 706 and the Clock-Q signal 724 is provided to a positive shift circuit 708. The gates 712 in the negative shift circuit 706 are configured to be coupled in parallel, when corresponding switches 716 are closed. In certain examples, the switches 716 are controlled by codes received in a multibit selection signal 702. Multibit selection signals 702, 704 are used to determine the number of the switches 716, 718 to be closed. In certain examples, the switches 718 are controlled by codes received in a multibit selection signal 704. In one example, the switches 716, 718 may be indexed such that the corresponding multibit selection signals 702, 704 identifies the highest numbered switch (e.g., Switch-N) to be closed and all switches 0-N are accordingly closed.

The gates 714 in the positive shift circuit 708 are configured to be coupled in parallel, when corresponding switches 718 are closed. The switches 716 and 718 can be used to select a phase of the output signal 710. Each of the gates 712 in the negative shift circuit 706 that is coupled through a closed switch pulls the phase of the output signal 710 toward the phase of the Clock-I signal 722. Each of the gates 714 in the positive shift circuit 708 that is coupled through a closed switch pulls the phase of the output signal 710 toward the phase of the Clock-Q signal 724. Accordingly, the phase of the output signal 710 is determined based on the number of closed switches in the negative shift circuit 706 and the positive shift circuit 708. Power savings can be obtained by powering down those gates that are not actively contributing to the output signal 710 and certain associated control circuits.

FIG. 8 is a flow diagram 800 illustrating an example of a method for identifying margins in an eye opening in accordance with certain aspects of the present disclosure. The eye opening may be visualized as a region of an eye diagram that indicates when a receiver or decoder can reliably sample, demodulate or decode information from a data signal. The eye diagram may be generated as an overlay of multiple consecutive symbol intervals. Signaling state of the data signal may be determined reliably in the eye opening. The method may be performed by an EOM that is implemented using some combination of hardware circuits and software modules. In one example, the EOM may include one or more of the circuits illustrated in FIGS. 4-7.

At block 802 of the flow diagram 800, first data is captured from a data signal based on edges in a data clock signal. At block 804, second data is captured from the data signal responsive to edges in a phase shifted version of the data clock signal. At block 806, a phase difference between the phase shifted version of the data clock signal and the data clock signal may be iteratively increased when the first data initially matches the second data until the first data differs from the second data. At block 808, the phase difference between the phase shifted version of the data clock signal and the data clock signal iteratively decreased when the first data initially differs from the second data until the first data matches the second data. At block 810, the margin of the eye opening may be determined when the first data begins to match the second data or when the first data begins to differ from the second data. A phase shift between a receive clock signal and the data clock signal remains unchanged until the margin of the eye opening is determined. The location in the eye opening of edges in the data clock signal remain substantially unchanged when the phase shift between the receive clock signal and the data clock signal remains unchanged. In some instances, the phase shifted version of the data clock signal is initially a quadrature version of the data clock signal.

In certain implementations, the eye opening monitor is included in a serial interface. The processing circuit may be configured to determine the margin of the eye opening while the serial interface is transferring data during a normal mode of operation. The EOM may be enabled periodically during the normal mode of operation. For example, a data sampling circuit used to capture the second data from the data signal may be disabled during the normal mode of operation unless the EOM is enabled. The eye opening monitor may be enabled when an error is detected in the data transferred during the normal mode of operation.

In certain implementations, the EOM includes a first phase control circuit that is configured to generate the data clock signal, and a second phase control circuit that responds to an output of the first phase control circuit and that is configured to control the phase difference between the phase shifted version of the data clock signal and the data clock signal. The second phase control circuit may be configured independently of the first phase control circuit.

An EOM configured in accordance with certain aspects of this disclosure has a first sampling circuit, a second sampling circuit and a processing circuit. The first sampling circuit may be configured to capture first data from a data signal responsive to edges in a data clock signal. The second sampling circuit may be configured to capture second data from the data signal responsive to edges in a phase shifted version of the data clock signal. The processing circuit may include one or more processors, controllers, finite state machines and/or some combination of sequential logic. execute software (see FIG. 1, for example). The processing circuit may be configured to manage certain aspects of a serial interface. The processing circuit may be further configured to implement the EOM or perform some function related to the EOM. The processing circuit configured to determine a margin of an eye opening by iteratively increasing a phase difference between the phase shifted version of the data clock signal and the data clock signal when the first data initially matches the second data until the first data differs from the second data, and/or iteratively decreasing the phase difference between the phase shifted version of the data clock signal and the data clock signal when the first data initially differs from the second data until the first data matches the second data. A phase shift between a receive clock signal and the data clock signal may remain unchanged while the processing circuit determines the margin of the eye opening. The phase shifted version of the data clock signal may initially be configured as a quadrature version of the data clock signal.

In some implementations, the EOM is included in a serial interface. The processing circuit may be further configured to determine the margin of the eye opening while the serial interface is transferring data during a normal mode of operation. The EOM may be enabled periodically during the normal mode of operation. The processing circuit may be further configured to modify the phase shift between the receive clock signal and the data clock signal when a change in location of the margin of the eye opening is detected. The EOM may be enabled when an error is detected in the data transferred during the normal mode of operation.

The EOM may additionally include a first phase control circuit that is configured to generate the data clock signal, and a second phase control circuit that responds to an output of the first phase control circuit and that is configured to control the phase difference between the phase shifted version of the data clock signal and the data clock signal. The second phase control circuit may be configured independently of the first phase control circuit.

The operational steps described in any of the exemplary aspects herein are described to provide a subset of examples of possible implementations. The operations described may be performed in numerous different sequences other than the illustrated sequences. Furthermore, operations described in a single operational step may actually be performed in a number of different steps. Additionally, one or more operational steps discussed in the exemplary aspects may be combined. It is to be understood that the operational steps illustrated in the flow diagrams may be subject to numerous different modifications as will be readily apparent to one of skill in the art. Those of skill in the art will also understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The various operations of methods described above may be performed by any suitable means capable of performing the corresponding functions. The means may include various hardware and/or software component(s) and/or module(s), including, but not limited to a circuit, an application-specific integrated circuit (ASIC), or processor. Generally, where there are operations illustrated in figures, those operations may have corresponding counterpart means-plus-function components with similar numbering.

In one example, an apparatus may include means for capturing data from a data signal to provide first data captured based on edges in a data clock signal and second data captured based on edges in a phase shifted version of the data clock signal. The apparatus may include means for modifying phase difference between the phase shifted version of the data clock signal and the data clock signal. The apparatus may include a controller configured to cause the means for modifying phase difference to iteratively increase the phase difference between the phase shifted version of the data clock signal and the data clock signal when the first data initially matches the second data until the first data differs from the second data, and/or cause the means for modifying phase difference to iteratively decrease the phase difference between the phase shifted version of the data clock signal and the data clock signal when the first data initially differs from the second data until the first data matches the second data. A phase shift between a receive clock signal and the data clock signal may remain unchanged while the processing circuit determines the margin of the eye opening. A margin of the eye opening may be determined when the first data begins to match the second data or when the first data begins to differ from the second data. A phase shift between a receive clock signal and the data clock signal remains unchanged until the margin of the eye opening is determined.

In some implementations, the apparatus is included in a serial interface. The controller may be further configured to determine the margin of the eye opening while the serial interface is transferring data during a normal mode of operation. The means for modifying phase difference may be enabled periodically during the normal mode of operation. The controller may be further configured to modify the phase shift between the receive clock signal and the data clock signal when a change in location of the margin of the eye opening is detected. The means for modifying phase difference may be enabled when an error is detected in the data transferred during the normal mode of operation.

The apparatus may include a first phase control circuit that is configured to generate the data clock signal, and a second phase control circuit that responds to an output of the first phase control circuit and that is configured to control the phase difference between the phase shifted version of the data clock signal and the data clock signal. The second phase control circuit may be configured independently of the first phase control circuit.

Some implementation examples are described in the following numbered clauses:

1. An eye opening monitor, comprising: a first sampling circuit configured to capture first data from a data signal responsive to edges in a data clock signal; a second sampling circuit configured to capture second data from the data signal responsive to edges in a phase shifted version of the data clock signal; and a processing circuit configured to determine a margin of an eye opening by: iteratively increasing a phase difference between the phase shifted version of the data clock signal and the data clock signal when the first data initially matches the second data until the first data differs from the second data; or iteratively decreasing the phase difference between the phase shifted version of the data clock signal and the data clock signal when the first data initially differs from the second data until the first data matches the second data, wherein a phase shift between a receive clock signal and the data clock signal remains unchanged while the processing circuit determines the margin of the eye opening.

2. The eye opening monitor as described in clause 1, wherein the phase shifted version of the data clock signal is initially a quadrature version of the data clock signal.

3. The eye opening monitor as described in clause 1 or clause 2, wherein the eye opening monitor is included in a serial interface, and wherein the processing circuit is further configured to determine the margin of the eye opening while the serial interface is transferring data during a normal mode of operation.

4. The eye opening monitor as described in clause 3, wherein the eye opening monitor is enabled periodically during the normal mode of operation and wherein the processing circuit is further configured to modify the phase shift between the receive clock signal and the data clock signal when a change in location of the margin of the eye opening is detected.

5. The eye opening monitor as described in clause 3 or clause 4, wherein the eye opening monitor is enabled when an error is detected in the data transferred during the normal mode of operation.

6. The eye opening monitor as described in any of clauses 1-5, further comprising: a first phase control circuit that is configured to generate the data clock signal; and a second phase control circuit that responds to an output of the first phase control circuit and that is configured to control the phase difference between the phase shifted version of the data clock signal and the data clock signal.

7. The eye opening monitor as described in clause 6, wherein the second phase control circuit is configured independently of the first phase control circuit.

8. An apparatus, comprising: means for capturing data from a data signal to provide first data captured based on edges in a data clock signal and second data captured based on edges in a phase shifted version of the data clock signal; means for modifying phase difference between the phase shifted version of the data clock signal and the data clock signal; and a controller configured to: cause the means for modifying phase difference to iteratively increase the phase difference between the phase shifted version of the data clock signal and the data clock signal when the first data initially matches the second data until the first data differs from the second data; cause the means for modifying phase difference to iteratively decrease the phase difference between the phase shifted version of the data clock signal and the data clock signal when the first data initially differs from the second data until the first data matches the second data; and determine the margin of the eye opening when the first data begins to match the second data or when the first data begins to differ from the second data, wherein a phase shift between a receive clock signal and the data clock signal remains unchanged until the margin of the eye opening is determined.

9. The apparatus as described in clause 8, wherein the phase shifted version of the data clock signal is initially a quadrature version of the data clock signal.

10. The apparatus as described in clause 8 or clause 9, wherein the apparatus is included in a serial interface, and wherein the controller is further configured to determine the margin of the eye opening while the serial interface is transferring data during a normal mode of operation.

11. The apparatus as described in clause 10, wherein the means for modifying phase difference is enabled periodically during the normal mode of operation and wherein the controller is further configured to modify the phase shift between the receive clock signal and the data clock signal when a change in location of the margin of the eye opening is detected.

12. The apparatus as described in clause 10 or clause 11, wherein the means for modifying phase difference is enabled when an error is detected in the data transferred during the normal mode of operation.

13. The apparatus as described in any of clauses 8-12, further comprising: a first phase control circuit that is configured to generate the data clock signal; and a second phase control circuit that responds to an output of the first phase control circuit and that is configured to control the phase difference between the phase shifted version of the data clock signal and the data clock signal, wherein the second phase control circuit is configured independently of the first phase control circuit.

14. A method for identifying margins in an eye opening, comprising: capturing first data from a data signal based on edges in a data clock signal; capturing second data from the data signal responsive to edges in a phase shifted version of the data clock signal; iteratively increasing a phase difference between the phase shifted version of the data clock signal and the data clock signal when the first data initially matches the second data until the first data differs from the second data; iteratively decreasing the phase difference between the phase shifted version of the data clock signal and the data clock signal when the first data initially differs from the second data until the first data matches the second data; and determining the margin of the eye opening when the first data begins to match the second data or when the first data begins to differ from the second data, wherein a phase shift between a receive clock signal and the data clock signal remains unchanged until the margin of the eye opening is determined.

15. The method as described in clause 14, wherein the phase shifted version of the data clock signal is initially a quadrature version of the data clock signal.

16. The method as described in clause 14 or clause 15, wherein the eye opening monitor is included in a serial interface, and wherein the processing circuit is configured to determine the margin of the eye opening while the serial interface is transferring data during a normal mode of operation.

17. The method as described in clause 16, further comprising: periodically enabling the eye opening monitor during the normal mode of operation; and modifying the phase shift between the receive clock signal and the data clock signal when a change in location of the margin of the eye opening is detected.

18. The method as described in clause 16 or clause 17, wherein the eye opening monitor is enabled when an error is detected in the data transferred during the normal mode of operation.

19. The method as described in any of clauses 14-18, further comprising: generating the data clock signal using a first phase control circuit; and controlling the phase difference between the phase shifted version of the data clock signal and the data clock signal using a second phase control circuit that responds to an output of the first phase control circuit.

20. The method as described in clause 19, wherein the second phase control circuit is configured independently of the first phase control circuit.

As used herein, a phrase referring to "at least one of" a list of items refers to any combination of those items, including single members. As an example, "at least one of: a, b, or c" is intended to cover a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c or any other ordering of a, b, and c).

The present disclosure is provided to enable any person skilled in the art to make or use aspects of the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples and designs described herein, but is to be accorded the widest scope consistent with the principles and novel features disclosed herein.

What is claimed is:

1. An eye opening monitor, comprising:

a first sampling circuit configured to capture first data from a data signal responsive to edges in a data clock signal;

a second sampling circuit configured to capture second data from the data signal responsive to edges in a phase shifted version of the data clock signal; and a processing circuit configured to determine a margin of an eye opening by:

iteratively increasing a phase difference between the phase shifted version of the data clock signal and the data clock signal when the first data initially matches the second data until the first data differs from the second data; or iteratively decreasing the phase difference between the phase shifted version of the data clock signal and the data clock signal when the first data initially differs from the second data until the first data matches the second data, wherein a phase shift between a receive clock signal and the data clock signal remains unchanged while the processing circuit determines the margin of the eye opening.

2. The eye opening monitor of claim 1, wherein the phase shifted version of the data clock signal is initially a quadrature version of the data clock signal.

3. The eye opening monitor of claim 1, wherein the eye opening monitor is included in a serial interface, and wherein the processing circuit is further configured to determine the margin of the eye opening while the serial interface is transferring data during a normal mode of operation.

4. The eye opening monitor of claim 3, wherein the eye opening monitor is enabled periodically during the normal mode of operation and wherein the processing circuit is further configured to modify the phase shift between the receive clock signal and the data clock signal when a change in location of the margin of the eye opening is detected.

5. The eye opening monitor of claim 3, wherein the eye opening monitor is enabled when an error is detected in the data transferred during the normal mode of operation.

6. The eye opening monitor of claim 1, further comprising:

a first phase control circuit that is configured to generate the data clock signal; and a second phase control circuit that responds to an output of the first phase control circuit and that is configured to control the phase difference between the phase shifted version of the data clock signal and the data clock signal.

7. The eye opening monitor of claim 6, wherein the second phase control circuit is configured independently of the first phase control circuit.

8. An apparatus, comprising:

means for capturing data from a data signal to provide first data captured based on edges in a data clock signal and second data captured based on edges in a phase shifted version of the data clock signal;

means for modifying phase difference between the phase shifted version of the data clock signal and the data clock signal; and a controller configured to:

cause the means for modifying phase difference to iteratively increase the phase difference between the phase shifted version of the data clock signal and the data clock signal when the first data initially matches the second data until the first data differs from the second data;

cause the means for modifying phase difference to iteratively decrease the phase difference between the phase shifted version of the data clock signal and the data clock signal when the first data initially differs from the second data until the first data matches the second data; and determine a margin of an eye opening when the first data begins to match the second data or when the first data begins to differ from the second data, wherein a phase shift between a receive clock signal and the data clock signal remains unchanged until the margin of the eye opening is determined.

9. The apparatus of claim 8, wherein the phase shifted version of the data clock signal is initially a quadrature version of the data clock signal.

10. The apparatus of claim 8, wherein the apparatus is included in a serial interface, and wherein the controller is further configured to determine the margin of the eye opening while the serial interface is transferring data during a normal mode of operation.

11. The apparatus of claim 10, wherein the means for modifying phase difference is enabled periodically during the normal mode of operation and wherein the controller is further configured to modify the phase shift between the receive clock signal and the data clock signal when a change in location of the margin of the eye opening is detected.

12. The apparatus of claim 10, wherein the means for modifying phase difference is enabled when an error is detected in the data transferred during the normal mode of operation.

13. The apparatus of claim 8, further comprising:

a first phase control circuit that is configured to generate the data clock signal; and a second phase control circuit that responds to an output of the first phase control circuit and that is configured to control the phase difference between the phase shifted version of the data clock signal and the data clock signal, wherein the second phase control circuit is configured independently of the first phase control circuit.

14. A method for identifying margins in an eye opening, comprising:

capturing first data from a data signal based on edges in a data clock signal;

capturing second data from the data signal responsive to edges in a phase shifted version of the data clock signal;

iteratively increasing a phase difference between the phase shifted version of the data clock signal and the data clock signal when the first data initially matches the second data until the first data differs from the second data; and iteratively decreasing the phase difference between the phase shifted version of the data clock signal and the data clock signal when the first data initially differs from the second data until the first data matches the second data, determining a margin of the eye opening when the first data begins to match the second data or when the first data begins to differ from the second data, wherein a phase shift between a receive clock signal and the data clock signal remains unchanged until the margin of the eye opening is determined.

15. The method of claim 14, wherein the phase shifted version of the data clock signal is initially a quadrature version of the data clock signal.

16. The method of claim 14, wherein the eye opening monitor is included in a serial interface, and wherein the margin of the eye opening is determined while the serial interface is transferring data during a normal mode of operation.

17. The method of claim 16, further comprising:

periodically enabling the eye opening monitor during the normal mode of operation; and modifying the phase shift between the receive clock signal and the data clock signal when a change in location of the margin of the eye opening is detected.

18. The method of claim 16, wherein the eye opening monitor is enabled when an error is detected in the data transferred during the normal mode of operation.

19. The method of claim 14, further comprising:

generating the data clock signal using a first phase control circuit; and controlling the phase difference between the phase shifted version of the data clock signal and the data clock signal using a second phase control circuit that responds to an output of the first phase control circuit.

20. The method of claim 19, wherein the second phase control circuit is configured independently of the first phase control circuit.

* * * * *